(12) United States Patent
Senda et al.

(10) Patent No.: US 11,094,759 B2
(45) Date of Patent: Aug. 17, 2021

(54) DISPLAY DEVICE AND METHOD OF MANUFACTURING DISPLAY DEVICE

(71) Applicant: Japan Display Inc., Minato-ku (JP)

(72) Inventors: Megumi Senda, Minato-ku (JP); Kazuto Tsuruoka, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/364,939

(22) Filed: Mar. 26, 2019

(65) Prior Publication Data

US 2019/0305061 A1    Oct. 3, 2019

(30) Foreign Application Priority Data

Mar. 28, 2018  (JP) .............. JP2018-061797

(51) Int. Cl.

| | | |
|---|---|---|
| *H01L 29/08* | (2006.01) | |
| *H01L 27/32* | (2006.01) | |
| *H01L 51/00* | (2006.01) | |
| *H01L 51/52* | (2006.01) | |
| *G09G 3/3266* | (2016.01) | |
| *H01L 51/56* | (2006.01) | |

(52) U.S. Cl.
CPC ....... *H01L 27/3246* (2013.01); *G09G 3/3266* (2013.01); *H01L 27/3276* (2013.01); *H01L 51/0097* (2013.01); *H01L 51/5246* (2013.01); *H01L 51/56* (2013.01); *H01L 2227/323* (2013.01)

(58) Field of Classification Search
CPC ............. H01L 27/3246; H01L 51/0097; H01L 51/5246; H01L 27/3276; H01L 51/56; H01L 2227/323; H01L 2251/5338; H01L 29/08; G09G 3/3266; G09G 2300/0426; G09G 3/3225
USPC ........................................... 257/40
See application file for complete search history.

(56) References Cited

U.S. PATENT DOCUMENTS

| | | | |
|---|---|---|---|
| 9,111,888 B2* | 8/2015 | Do ............... | H01L 51/5271 |
| 9,306,190 B2* | 4/2016 | Kim .............. | H01L 27/3246 |
| 9,443,916 B2* | 9/2016 | Lee .............. | H01L 27/3246 |
| 9,513,514 B2* | 12/2016 | Chen ............ | G02F 1/1339 |
| 10,446,637 B2* | 10/2019 | Odaka .......... | H01L 24/83 |
| 10,495,584 B2* | 12/2019 | Hwang ......... | G01N 21/21 |
| 2014/0014960 A1* | 1/2014 | Yamazaki ..... | H01L 27/322 |
| | | | 257/59 |
| 2014/0042408 A1* | 2/2014 | Akagawa ...... | H01L 51/56 |
| | | | 257/40 |

(Continued)

FOREIGN PATENT DOCUMENTS

| | | |
|---|---|---|
| JP | 2016-031499 | 3/2016 |
| JP | 2017-147165 | 8/2017 |

*Primary Examiner* — Caleb E Henry
(74) *Attorney, Agent, or Firm* — Oblon, McClelland, Maier & Neustadt, L.L.P.

(57) ABSTRACT

A manufacturing method of a display device according to an embodiment of the present invention includes: forming a damming part in a component mounting area of a flexible base material having a display area provided with a plurality of pixels and the component mounting area where a component is mounted; and applying a resin composition to the component mounting area of the base material in a condition in which the component is mounted thereon, in this order. An outer periphery of the applied resin composition reaches a lateral surface of the damming part.

5 Claims, 6 Drawing Sheets

(56) References Cited

U.S. PATENT DOCUMENTS

| | | | |
|---|---|---|---|
| 2015/0137098 A1* | 5/2015 | Tanaka | H01L 51/5246 257/40 |
| 2015/0144977 A1* | 5/2015 | Odaka | H01L 33/44 257/98 |
| 2015/0333292 A1* | 11/2015 | Sato | H01L 51/0096 257/40 |
| 2016/0113106 A1* | 4/2016 | Kim | H05K 1/028 361/749 |
| 2016/0293870 A1* | 10/2016 | Nakagawa | H01L 51/0097 |
| 2017/0179432 A1* | 6/2017 | Visweswaran | H01L 27/3211 |
| 2017/0244063 A1 | 8/2017 | Furuie | |
| 2018/0069195 A1 | 3/2018 | Furuie | |
| 2018/0350893 A1* | 12/2018 | Odaka | H01L 24/83 |

* cited by examiner

DISPLAY DEVICE AND METHOD OF MANUFACTURING DISPLAY DEVICE

CROSS-REFERENCE TO RELATED APPLICATION

The present application claims priority from Japanese Application JP 2018-61797 filed on Mar. 28, 2018, the content of which is hereby incorporated by reference into this application.

BACKGROUND OF THE INVENTION

1. Field of the Invention

One or more embodiments of the present invention relate to a display device and a manufacturing method of a display device.

2. Description of the Related Art

As to a display device provided with a display area, such as an organic electroluminescence (EL) display device and a liquid crystal display device, recent years, a flexible display is being developed whose display panel is bendable by using a base material having flexibility.

For example, as disclosed in Japanese Patent Application Laid-Open No. 2016-031499, it is suggested to bend a mounting part of a component such as an integrated circuit (IC) and a flexible printed circuits (FPC) toward the backside of the display area, and narrow the frame.

SUMMARY OF THE INVENTION

There is a case where the mounting part on which the component as described above is mounted is protected by a resin material. On the other hand, due to the protection by the resin material, there can be a problem that a quality of a product to be obtained does not meet a predetermined standard. For example, as described above, when using a base material having flexibility, the resin material may affect the degree to which the display panel is bent.

Regarding the issue as described above, the object of an embodiment of the present invention is to provide a display device, a mounting part of which is satisfactorily protected and which has an excellent quality, and a manufacturing method thereof.

According to one aspect of the present invention, a manufacturing method of a display device is provided. The manufacturing method of a display device includes: forming a damming part in a component mounting area of a flexible base material having a display area provided with a plurality of pixels and the component mounting area where a component is mounted; and applying a resin composition to the component mounting area of the base material in a condition in which the component is mounted thereon, in this order. An outer periphery of the applied resin composition reaches a lateral surface of the damming part.

According to another aspect of the present invention, a display device is provided. The display device includes: a flexible base material having a display area provided with a plurality of pixels and a component mounting area where a component is mounted; a resin layer which covers at least a part of the component mounting area of the base material; and a damming part which is provided on the component mounting area of the base material. An outer periphery of the resin layer contacts a lateral surface of the damming part.

DETAILED DESCRIPTION OF THE INVENTION

Figure 1:
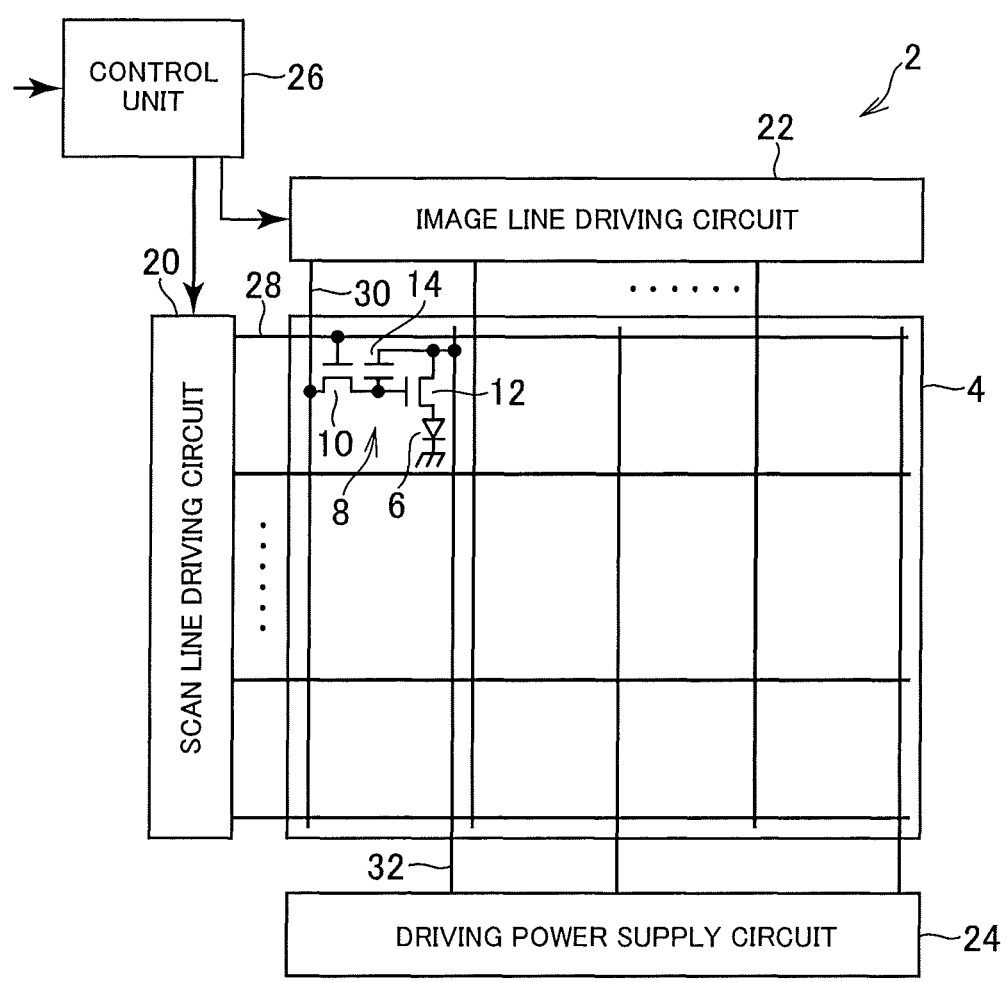
FIG. 1 is a schematic diagram which shows the schematic configuration of an organic EL display device according to an embodiment of the present invention.

Below, the one or more embodiments of the present invention are explained with reference to the accompanying drawings. Note that the one or more disclosed embodiments are merely examples, and an appropriate variation which those skilled in the art can easily arrive at without departing from the spirit of the present invention is naturally included in the scope of the present invention. Further, while the width, thickness, shape, and the like of each part in the drawings may be illustrated schematically as compared with the actual embodiments in order to clarify the explanation, these are merely examples, and an interpretation of the present invention should not be limited thereto. Furthermore, in the specification and the respective drawings, the same reference symbols may be applied to elements similar to those which have already been illustrated in another drawing, and a detailed description of such elements may be omitted as appropriate.

Further, in the detailed description of the one or more embodiments of the present invention, when a positional relationship between one component and another component is defined, the words "on" and "under" are not used only in a case where the other component is positioned directly on or directly under the one component, but those words are also used in a case where still another component is interposed between the one component and the other component, unless otherwise stated.

FIG. 1 is a schematic diagram which shows the schematic configuration of a display device according to one embodiment of the present invention, choosing an organic EL display device as an example. An organic EL display device 2 includes a pixel array part 4 which displays an image, and a driving part which drives the pixel array part 4. The organic EL display device 2 is a flexible display which uses a resin film as a base material, and a lamination structure such as a thin film transistor (TFT) and an organic light emitting diode (OLED) is formed on the base material constituted by this resin film. Note that the schematic diagram shown in FIG. 1 is an example, and the present embodiment is not limited to the configuration shown in it.

In the pixel array part 4, an OLED 6 and a pixel circuit 8 are arranged in a matrix form, corresponding to a pixel. The pixel circuit 8 is constituted by a plurality of TFTs 10 and 12, and a capacitor 14.

The driving part as described above includes a scan line driving circuit 20, an image line driving circuit 22, a driving power supply circuit 24, and a control unit 26. The driving part drives the pixel circuit 8, and controls light emission of the OLED 6.

The scan line driving circuit 20 is connected to a scan signal line 28 provided for each horizontal line of pixels (pixel row). In accordance with timing signals input from the control unit 26, the scan line driving circuit 20 selects scan signal lines 28 in order, and applies a voltage for turning on the lighting TFT 10 to the selected scan signal line 28.

The image line driving circuit 22 is connected to an image signal line 30 provided for each vertical line of pixels (pixel column). The image line driving circuit 22 receives of an image signal from the control unit 26, and, in accordance with the selection of the scan signal line 28 by the scan line driving circuit 20, outputs a voltage corresponding to an image signal of the selected pixel row to each image signal line 30. The voltage is written into the capacitor 14 via the lighting TFT 10 at the selected pixel row. The driving TFT 12 supplies an electric current corresponding to the written voltage to the OLED 6, and thus the OLED 6 of a pixel corresponding to the selected scan signal line 28 emits light.

The driving power supply circuit 24 is connected to a driving power supply line 32 provided for each pixel column, and supplies an electric current to the OLED 6 via the driving electric power supply line 32 and the driving TFT 12 of the selected pixel row.

Here, a lower electrode of the OLED 6 is connected to the driving TFT 12. On the other hand, an upper electrode of each OLED 6 is composed of an electrode shared in common by the OLEDs 6 of all the pixels. In a case where the lower electrode is configured as an anode, a high electric potential is input thereto, and the upper electrode becomes a cathode and a low electric potential is input thereto. In a case where the lower electrode is configured as a cathode, a low electric potential is input thereto, and the upper electrode becomes an anode and a high electric potential is input thereto.

Figure 2:
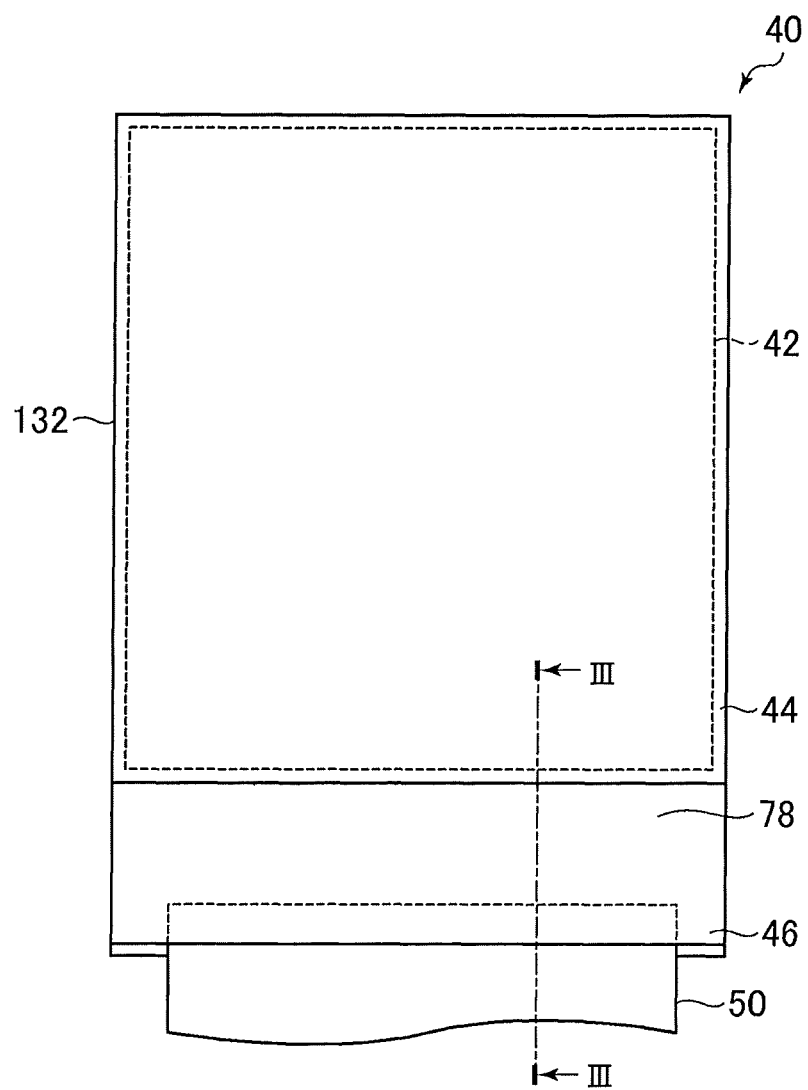
FIG. 2 is a schematic plan diagram which shows an example of a display panel of the organic EL display device shown in FIG. 1.

FIG. 2 is a schematic plan diagram showing an example of a display panel of the organic EL display device shown in FIG. 1. In a display area 42 of the display panel 40, the pixel array part 4 shown in FIG. 1 is provided, and as described above, the OLED 6 is arranged in the pixel array part 4. As described above, an upper electrode which constitutes the OLED 6 is formed so as to be shared in common by the respective pixels, and covers the whole of the display area 42. On the surface of the display panel 42, a surface film 132 which covers the whole of the display area 42 is disposed.

On one side of the display panel 40 which is rectangular, a component mounting area 46 is provided, and a wiring connected to the display area 42 is disposed. To the component mounting area 46, an FPC 50 is connected. The FPC 50 is connected to the control unit 26, the other circuits 20, 22, and 24, and the like, and an IC is mounted on the FPC 50. Though not illustrated, on the component mounting area 46, a driver IC which constitutes the driving unit may be loaded. On the component mounting area 46, a resin layer 78 is disposed so as to cover the edge part of the FPC 50.

Figure 3:
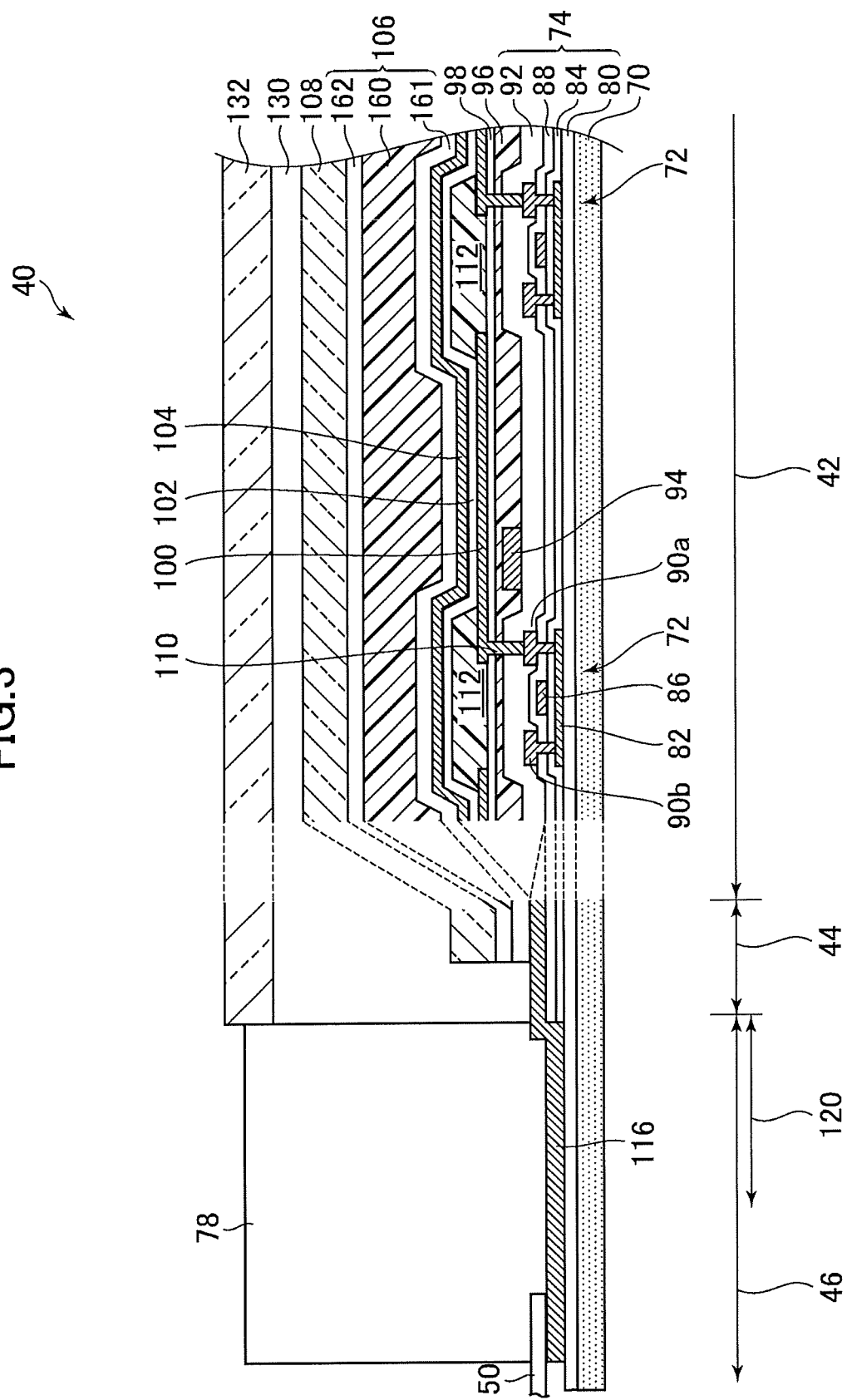
FIG. 3 is a diagram which shows an example of III-III cross section of FIG. 2.

FIG. 3 is a diagram which shows an example of III-III cross section of FIG. 2. In FIG. 3, hatching of some of the layers is omitted for making the cross sectional structure easy to see.

The display panel 40 has a structure where a circuit layer 74 including a TFT 72 and the like formed therein, the OLED 6, a sealing layer 106 to seal the OLED 6, and the like are laminated on a base material 70 constituted by a resin film. As resin which constitutes the base material 70, for example, polyimide based resin can be mentioned. The thickness of the base material 70 is, for example, 10 μm to 20 μm. In the present embodiment, the pixel array part 4 is of the top emission type, and light generated in the OLED 6 is emitted to the side opposite from the base material 70 (upward in FIG. 3). Note that in the case where the color filter method is chosen as the colorization method of the organic EL display device 2, for example, in the display panel 40 a color filter is disposed on the sealing layer 106 at its side opposite from the side the base material 70 exists (the upper side) or on the opposition substrate side. By having white light generated in the OLED 6 go through this color filter, for example, lights of red (R), green (G), and blue (B) are generated.

In the circuit layer 74 of the display area 42, the pixel circuit 8, the scan signal line 28, the image signal line 30, the driving electric power supply line 32 which are described above, and the like are formed. At least a part of the driving unit can be formed on the base material 70 as the circuit layer 74 in an area adjacent to the display area 42. As described above, the FPC 50 and the driver IC constituting the driving unit can be connected to a wiring 116 of the circuit layer 74 in the component mounting area 46.

As shown in FIG. 3, on the base material 70, an under layer 80 is disposed which is formed of an inorganic insulating material. As the inorganic insulating material, for example, silicon nitride ($SiN_y$), silicon oxide ($SiO_x$), and a complex thereof are used.

In the display area 42, on the base material 70, a semiconductor area 82 to be a channel part and a source/drain part of the top gate type TFT 72 is formed with an interposition of the under layer 80. The semiconductor area 82 is formed of, for example, polysilicon (p-Si). The semiconductor area 82 is formed by, for example, providing a semiconductor layer (a p-Si film) on the base material 70, patterning this semiconductor layer, and selectively leaving a part which is used at the circuit layer 74.

On the channel part of the TFT 72, a gate electrode 86 is disposed with an interposition of a gate insulating film 84. The gate insulating film 84 is typically formed of TEOS. The gate electrode 86 is formed by, for example, patterning a metal film formed by sputtering or the like. On the gate electrode 86, an interlayer insulating layer 88 is disposed so as to cover the gate electrode 86. The interlayer insulating layer 88 is formed of, for example, the inorganic insulating material as described above. Into the semiconductor area 82 (p-Si) to be the source/drain part of the TFT 72, impurities are injected by ion injection, a source electrode 90*a* and a drain electrode 90*b* that are electrically connected to the semiconductor area 82 are further formed, so that the TFT 72 is formed.

On the TFT 72, the interlayer insulating film 92 is disposed. On the surface of the interlayer insulating film 92, a wiring 94 is disposed. The wiring is formed by, for example, patterning a metal film formed by sputtering or the like. With the metal film to form the wiring 94, and the metal film used for forming the gate electrode 86, the source electrode 90*a*, and the drain electrode 90*b*, for example, the wiring 116, and the scan signal line 28, the image signal line 30, and the driving electric power supply line 32 shown in FIG. 1 can be formed as a multilayer wiring structure. On this, a planarizing film 96 and a passivation film 98 are formed, and in the display area 42, the OLED 6 is formed on the passivation film 98. The planarizing film is formed of, for example, an organic insulating material such as a resin material. The passivation film is formed of, for example, an inorganic insulating material such as $SiN_y$.

The OLED 6 includes a lower electrode 100, an organic material layer 102, and an upper electrode 104. Specifically, the organic material layer 102 includes a hole transport layer, a light emitting layer, an electron transport layer, and the like. The OLED 6 is typically formed by laminating the lower electrode 100, the organic material layer 102, and the upper electrode 104 in this order from the side where the base material exists. In the present embodiment, the lower electrode 100 is an anode of the OLED 6, and the upper electrode 104 is a cathode.

If the TFT 72 shown in FIG. 3 is a driving TFT 12 having an n-channel, the lower electrode 100 is connected to the source electrode 90*a* of the TFT 72. Specifically, after forming the planarizing film 96 as described above, a contact hole 110 for connecting the lower electrode 100 to the TFT 72 is formed, and for example, by patterning a conductive body part formed on the surface of the planarizing film 96 and inside the contact hole 110, the lower electrode 100 connected to the TFT 72 is formed for each pixel. The lower electrode is formed of, for example, a transparent conductive material such as ITO (Indium Tin Oxide) and IZO (Indium Zinc Oxide), and metal such as Ag and Al.

On the structure as described above, a rib 112 which separates the pixels is disposed. For example, after forming the lower electrode 100, the rib 112 is formed at a boundary of the pixel surrounded by the rib 112, and in the effective area (an area where the lower electrode 100 is exposed) the organic material layer 102 and the upper electrode 104 are laminated. The rib 112 is formed of an organic insulating material such as a resin material. The upper electrode 104 is constituted by, for example, a transparent conductive material such as ITO and IZO and ultra-thin alloy of Mg and Ag.

On the upper electrode 104, the sealing layer 106 is disposed so as to cover the whole of the display area 42. The sealing layer 106 has a lamination structure which includes a first sealing film 161, a sealing planarizing film 160, and a second sealing film 162 in this order. The first sealing film 161 and the second sealing film 162 are formed of an inorganic material (such as an inorganic insulating material). Specifically, they are formed by forming a $SiN_y$ film by the chemical vapor deposition (CVD) method. The sealing planarizing film 160 is formed of an organic material (for example, a resin material such as acrylic based resin). Specifically, it is formed by applying a resin composition thereto by the inkjet method. In the periphery of the sealing layer 106 the sealing planarizing film 160 is not formed, and the first sealing film 161 and the second sealing film 162 contact each other. The sealing planarizing film 160 is covered by the second sealing film 162 at its upper surface and at its edge part. On the other hand, the sealing layer 106 is not disposed on the component mounting area 46, since a component is connected to it.

On the sealing layer 106, a protective layer 108 is disposed so as to cover the whole of the display area 42. The protective layer 108 is formed of, for example, an organic material (for example, a resin material such as acrylic based resin). Specifically, it is formed by pattern formation using a photosensitive resin composition, or by applying a resin composition by the inkjet method. In the frame area 44 which surrounds the display area 42, the edge part of the sealing layer 106 (the edge part of the first sealing film 161 and the second sealing film 162) is cut off at the position of the outer periphery of the protective layer 108.

Specifically, in a plan view, the edge part of the protective layer 108 and the edge part of the first sealing film 161 and the second sealing film 162 are aligned to each other. The protective layer 108 is, for example, in the manufacturing process of the display panel 40, used as a mask of when a predetermined area of the formed inorganic material film (a predetermined area on the wiring 116) is removed by etching and the first sealing film 161 and the second sealing film 162 are formed. In the present embodiment, the protective layer 108 remains on the product (the display panel 40) as it is without being removed, but the protective layer 108 may be removed after the etching.

For example, in order to secure the mechanical strength of the surface of the display panel 40, on the protective film 108, the surface film 132 is disposed with an interposition of the adhesion layer 130. The surface film 132 may include an optic film such as a retardation layer and a polarizer. On the other hand, the surface film 132 is not disposed on the component mounting area 46, since some component is connected to it.

The display panel 40 can be, as shown in FIG. 3, manufactured while keeping the base material 70 to be in a planar form. On the other hand, for example, when the display panel 40 is stored in the housing of the organic display device 2, a bendable area 120 is provided outside the display area 42, and the component mounting area 46 is disposed on the backside of the display area 42. Specifically, the display panel 40 is bent between the display area 42 and a part where the FPC 50 is mounted of the component mounting area 46, and the FPC is folded back to the backside of the display area 42.

In the bendable area 120, it is preferred to omit or thin at least a part of the layers formed of an inorganic insulating material (for example, the under layer 80, the interlayer insulating film 88, the interlayer insulating film 92, and the passivation film 98). The reason is that a layer formed of an inorganic insulating material tends to be broken easily by bending. In the illustrated example, in the bendable area 120, the wiring 116 is disposed on the under layer 80.

In the component mounting area 46 (including the bendable area 120), the resin layer 78 is disposed so as to directly cover the wiring 116 and the FPC 50. The resin layer 78 is formed of a resin material such as acrylic based resin. The thickness of the resin layer 78 is, for example, 70 µm to 100 µm. The thickness of the resin layer 78 can be set in consideration of the bending degree. For example, the thickness of the resin layer 78 is set in consideration of the neutral surface of when it is bent. Thus, the thickness of the resin layer 78 may be demanded to have high uniformity.

Figure 4:
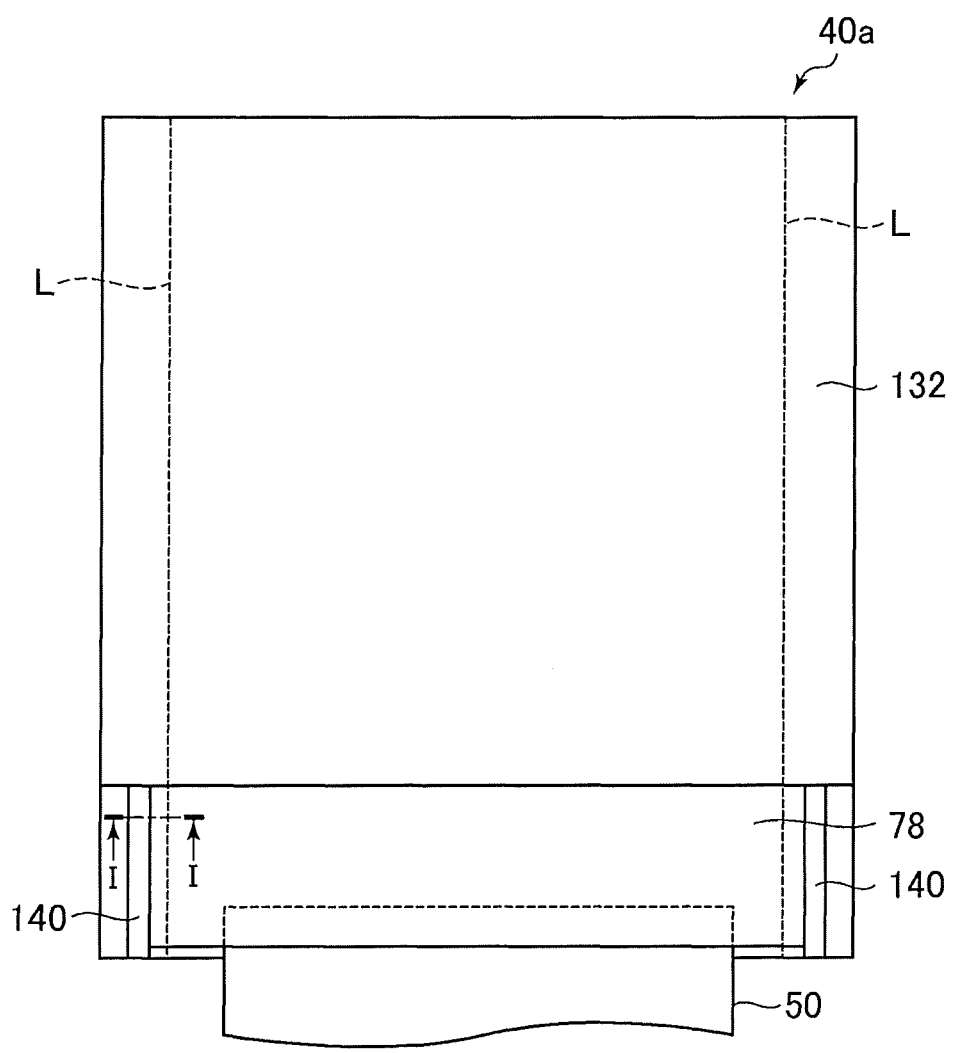
FIG. 4 is a diagram for explaining a manufacturing method of an organic EL display device according to an embodiment of the present invention.
Figure 5:
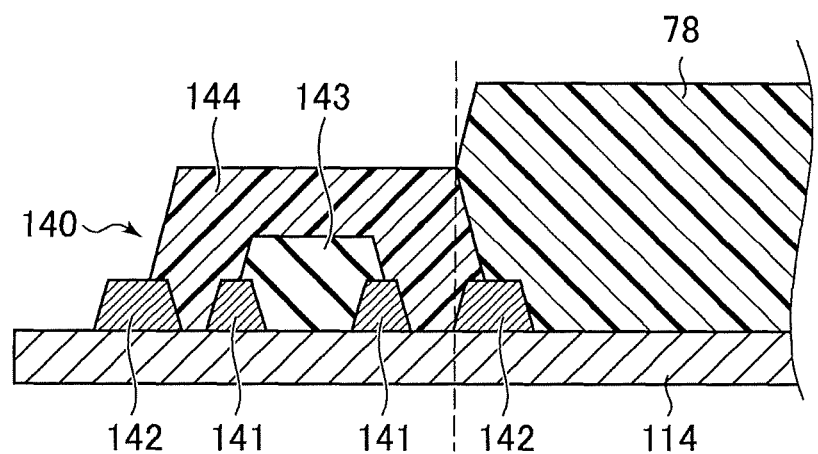
FIG. 5 is a diagram which shows an example of I-I cross section of FIG. 4.

FIG. 4 and FIG. 5 are figures to explain the manufacturing method of the organic EL display device according to one embodiment of the present invention. FIG. 4 is a plan diagram which shows a state of the display panel shown in FIG. 2 before it is cut in the manufacturing process (referred to as a display panel intermediate), and FIG. 5 is a diagram which shows an example of I-I cross section of FIG. 4. Specifically, the display panel intermediate 40*a* is cut along the broken line shown in FIG. 4, and the display panel 40 shown in FIG. 2 can be obtained. In one embodiment, the cutting is performed when the display panel intermediate is divided into individual panels. Note that in FIG. 5, as to the lamination structure of the display panel 40 shown in FIG. 3, the lamination structure starting from the base material 70 to the wiring 116 is illustrated in a simplified manner as a substrate 114.

On the display panel intermediate 40a, at each of edge parts opposed to each other of the component mounting area 46 (the bendable area 120), a damming part 140 is provided, and the outer periphery of the resin layer 78 reaches the lateral side of the damming part 140. Specifically, the outer periphery of the resin layer 78 contacts the lateral surface of the damming part 140. The damming part 140 is formed outside the cutline L, to be like a line which extends in a direction along the cutline L, and the resin layer 78 fills the area surrounded by the surface film 132 and the damming parts 140.

As shown in FIG. 5, the damming part 140 is constituted by a pair of first damming parts (projecting line parts) 141 which are formed at a predetermined interval, a pair of second damming parts (projecting line parts) 142 which are formed at a predetermined interval outside the pair of the first damming parts 141, a third damming part (a bank) 143 which fills an area between the pair of the first damming parts 141, and a fourth damming part (a bank) 144 which fills an area between the pair of the second damming parts 142 and covers the first damming parts 141 and the third damming part 143.

The first damming parts 141 and the second damming parts 142 are formed, for example, when forming a pixel (the circuit layer 74 and the OLED 6) on the base material 70 in the display area 42. Materials which forms the first damming parts 141 and the second damming parts 142 are not limited in particular; it can be any of an inorganic material, an organic material (a resin material), and a mixture of those. Heights of the first damming parts 141 and the second damming parts 142 are, for example, 2 μm. The first damming parts 141 and the second damming parts 142 are preferably formed of a resin material, because the heights as described above can be easily attained. Specifically, the first damming parts 141 and the second damming parts 142 are respectively formed in the display area 42 when the planarizing film 96 and/or the rib 112 are/is formed.

The third damming part 143 includes a resin material, and for example the third damming part 143 is formed when forming the sealing planarizing film 160 on the base material 70 in the display area 42. Specifically, a resin composition is applied to the area between the pair of first damming parts 141 which are provided in advance, and that area is filled by the resin composition. A height of the third damming part 143 is, for example, 10 μm.

The fourth damming part 144 includes a resin material, and for example the fourth damming part 144 is formed when forming the protective layer 108 on the base material 70 in the display area 42. Specifically, a resin composition is applied to the area between the pair of second damming parts 142 which are provided in advance, that area is filled by the resin composition, and the first damming parts 141 and the third damming part 143 are covered thereby. A height of the fourth damming part 144 is, for example, 20 μm.

After forming the damming part 140 on the base material 70, the resin layer 78 is formed. Specifically, by applying the resin composition by the inkjet method or the like so as to fill the area surrounded by the surface film 132 and the damming parts 140, and cover the bending area 120 and the edge part of the FPC 50 mounted thereon in advance, the resin layer is formed. By providing the damming part 140, a product having constant quality can be manufactured with a good yield. Specifically, in the case where the viscosity of the resin composition is set to be low regarding uniform application of the resin composition, there is a fear that the resin composition spreads outward, and the resin layer 78 is formed to go beyond the boundary of the desired formation area. On the other hand, when the viscosity of the resin composition is set to be high for improving the application precision, there is a fear that the resin composition cannot be applied uniformly in the desired area. By providing the damming part 140, such a problem can be prevented. Further, by providing the damming part 140, the thickness of the resin layer 78 to be formed can be satisfactorily controlled, and for example, the neutral surface of when the display panel is bent can be satisfactorily controlled.

The arrangement, the shape (thickness), and the like of the damming part 140 are determined depending on, for example, the formation area, the thickness, or the like of the resin layer 78. Specifically, the applied resin composition is dammed by the lateral surface of the damming part 140, and therefore depending on the desired formation area and thickness of the resin layer 78, the arrangement and the shape (thickness) of the damming part 140 are determined. In the illustrated example, the edge part of the upper surface of the damming part 140 is aligned to the desired end of the application of the resin composition designated by a broken line. After subjecting any appropriate treatment (for example, light irradiation, heating, drying, or the like) to the applied resin composition according to the need, the display panel 40 can be obtained by cutting, along the cutline L, both of the edge parts opposed to each other of the display panel intermediate 40a. Note that in the present embodiment, regarding the area where the FPC 50 is mounted, the uniformity of the thickness of the resin layer 78 is not so necessary as that of the bending area 120, and thus a damming part is not provided on the side where the FPC 50 is mounted.

Figure 6:
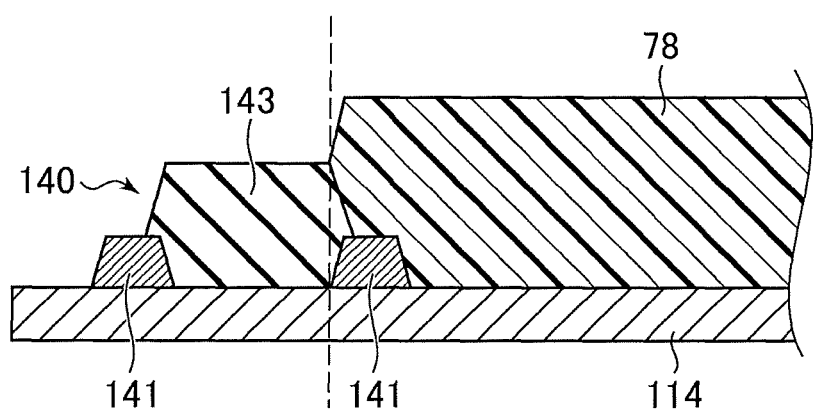
FIG. 6 is a diagram which shows a variation of I-I cross section of FIG. 4.

FIG. 6 is a diagram which shows a variation of I-I cross section of FIG. 4. This variation differs from the embodiment as described above in that the second damming parts 142 and the fourth damming part 144 are not provided. As compared with the embodiment as described above, the height of the damming part 140 is small, but the formation area of the damming part 140 can be narrowed. Here, the third damming part 143 is formed, for example, when the sealing planarizing film 160 and/or the protective layer 108 are/is formed in the display area 42.

Figure 7:
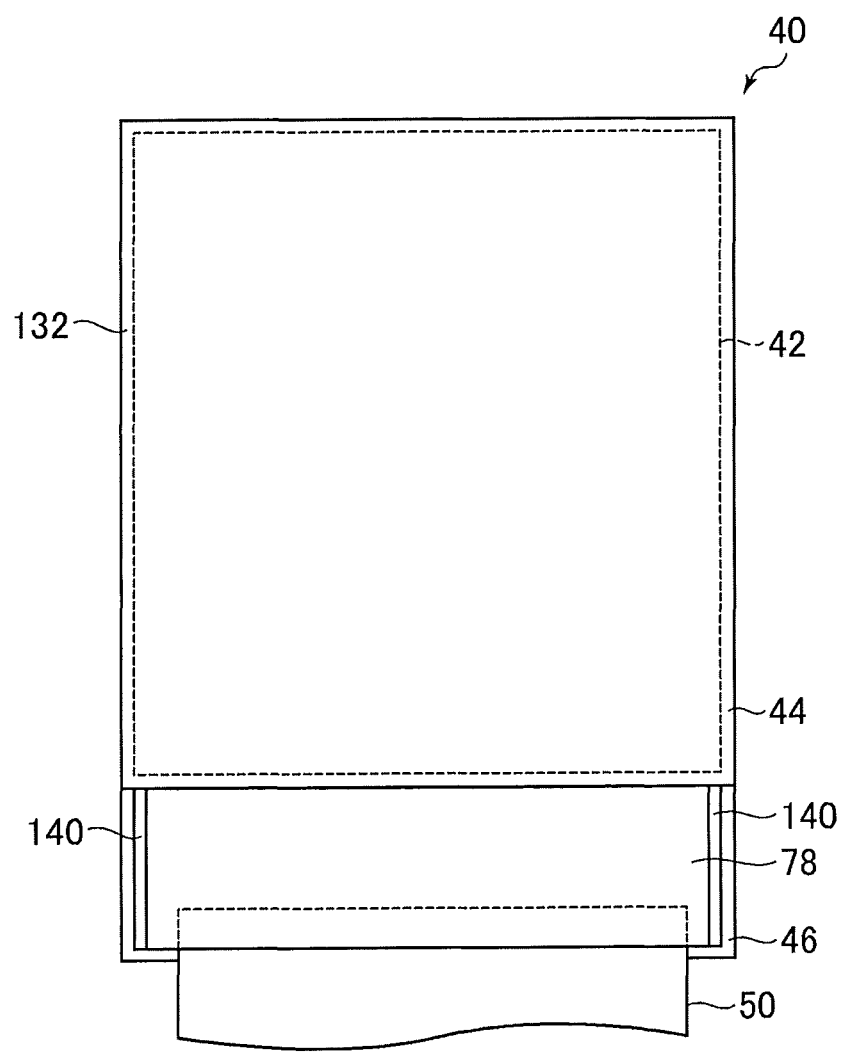
FIG. 7 is a schematic plan diagram which shows a variation of a display panel of the organic EL display device shown in FIG. 1.

FIG. 7 is a schematic plan diagram which shows a variation of the display panel of the organic EL display device shown in FIG. 1. This variation differs from the embodiment as described above in that the damming parts 140, which are formed at both of the edge parts of the component mounting area 46 of the display panel intermediate 40a of the embodiment as described above, remain on the product (the display panel 40). As to this variation, for example, in order to prevent a breakage of the damming part 140 at the time when the display panel 40 is bent, it is preferred to form the damming part 140 of an organic material (a resin material).

The present invention is not limited to the embodiments as described above, and various types of variations can be made. For example, a replacement with a configuration which is substantially the same as the configurations shown in the embodiments as described above, a configuration which exhibits the same technical effect, or a configuration which can attain the same objective can be made.

It is understood that without departing from the spirit of the present invention, those skilled in the art can arrive at various types of variations and modifications, and such variations and modifications belong to the scope of the present invention. For example, each of the embodiments as described above to which addition, deletion, or design change of components, or addition, omission, or condition change of processes is suitably applied by those skilled in the art are also encompassed within the scope of the present invention as long as they fall within the spirit of the present invention.

What is claimed is:

1. A display device comprising:
a flexible base material having a display area provided with a plurality of pixels and a component mounting area where a component is mounted;
a resin layer which covers at least a part of the component mounting area of the base material and is not located in the display area; and
a damming part which is provided on the component mounting area of the base material, wherein
the display area and the component mounting area are adjacent to each other in a first direction,
the damming part is provided along the first direction and located at each of edge parts opposed to each other of the component mounting area, and
the resin layer is located between a pair of the damming parts at the edge parts, and an outer periphery of the resin layer contacts a lateral surface of the damming part.

2. The display device according to claim 1, wherein
the component mounting area includes a bendable area positioned on its side on which the display area is positioned, and
the resin layer covers the bendable area.

3. The display device according to claim 1, wherein
the resin layer covers at least a part of the component mounted on the component mounting area.

4. The display device according to claim 1, wherein
the damming part includes a resin material.

5. The display device according to claim 1, wherein
the damming part has a pair of projecting line parts which are formed at a predetermined interval along the first direction, and a bank to fill an area between the pair of projecting line parts.

* * * * *